(12) United States Patent
Murai (10) Patent No.: US 7,645,693 B2
(45) Date of Patent: Jan. 12, 2010

(54) SEMICONDUCTOR DEVICE AND PROGRAMMING METHOD THEREFOR

(75) Inventor: Hiroshi Murai, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 25 days.

(21) Appl. No.: 11/414,647

(22) Filed: Apr. 27, 2006

(65) Prior Publication Data
US 2007/0054454 A1 Mar. 8, 2007

Related U.S. Application Data

(63) Continuation of application No. PCT/JP2005/008059, filed on Apr. 27, 2005.

(51) Int. Cl.
*H01L 21/44* (2006.01)
(52) U.S. Cl. ........... 438/598; 438/129; 438/599; 257/208; 257/210; 257/211
(58) Field of Classification Search ........... 438/597, 438/598, 599, 262, 128, 129; 257/207, 208, 257/210, 211
See application file for complete search history.

(56) References Cited

U.S. PATENT DOCUMENTS

| 5,784,325 | A | 7/1998 | Arase et al. |
| 5,923,606 | A | 7/1999 | Lee et al. |
| 6,011,725 | A | 1/2000 | Eitan |
| 6,226,214 | B1 | 5/2001 | Choi |
| 6,388,910 | B1 * | 5/2002 | Fu .............. 365/51 |
| 2004/0108512 | A1 * | 6/2004 | Iwata et al. ......... 257/100 |

FOREIGN PATENT DOCUMENTS

| EP | 0 880 144 | 11/1998 |
| JP | 09-232427 | 9/1997 |
| JP | 10-125806 | 5/1998 |
| JP | 10-334684 | 12/1998 |
| WO | WO 2006117854 A1 * | 11/2006 |

* cited by examiner

*Primary Examiner*—Michael Trinh (57) ABSTRACT

A semiconductor device includes bit lines (14) provided in a semiconductor substrate (10), word lines (16) provided above the bit lines and running in a width direction of the bit lines (14), metal lines (22) provided above the word lines (16) and running in a length direction of the bit lines (14), and bit line contact regions (28) running in the length direction of the word lines (16) and located between word line regions (26) in which a plurality of word lines (16) are disposed. Each of the bit lines (14) is connected with every other metal line (22) in the bit line contact regions (28). It is thus possible to provide a semiconductor device and a fabrication method therefor in which an alignment margin can be ensured between a contact hole (18) and the bit line (14) to enable downsizing of a memory cell.

12 Claims, 14 Drawing Sheets

SEMICONDUCTOR DEVICE AND PROGRAMMING METHOD THEREFOR

CROSS-REFERENCES TO RELATED APPLICATIONS

This is a continuation of International Application No. PCT/JP2005/008059, filed Apr. 27, 2005 which was not published in English under PCT Article 21(2).

BACKGROUND OF THE INVENTION

1. Field of the Invention

This invention relates generally to semiconductor devices and fabrication methods therefor, and more particularly, to a semiconductor device that serves as a non-volatile memory with the use of a transistor having multiple charge storage layers and a fabrication method therefor.

2. Description of the Related Art

Recently, non-volatile memories in which data is rewritable have been widely used. In the technical field of non-volatile memories, efforts are being made to miniaturize a memory cell for high memory capacity and to reduce fluctuation in electrical characteristics of a transistor incorporated in the memory. The non-volatile memories include Metal Oxide Nitride Oxide silicon (MONOS) flash memories and Silicon Oxide Nitride Oxide silicon (SONOS) flash memories, in which the charge is stored in an Oxide Nitride Oxide (ONO) film. In addition, another type of flash memory having two or more charge storage regions in one transistor has been developed for the purpose of high memory capacity.

U.S. Pat. No. 6,011,725 discloses an example of a transistor having two charge storage regions arranged between a gate electrode and a semiconductor substrate. In the transistor, a source and a drain are replaced by each other for symmetrical operation for a structure in which a source region and a drain region are not distinguished. In addition, a bit line also serves as the source region and the drain region and is embedded in a semiconductor substrate to further miniaturize the memory cell.

Figure 1:
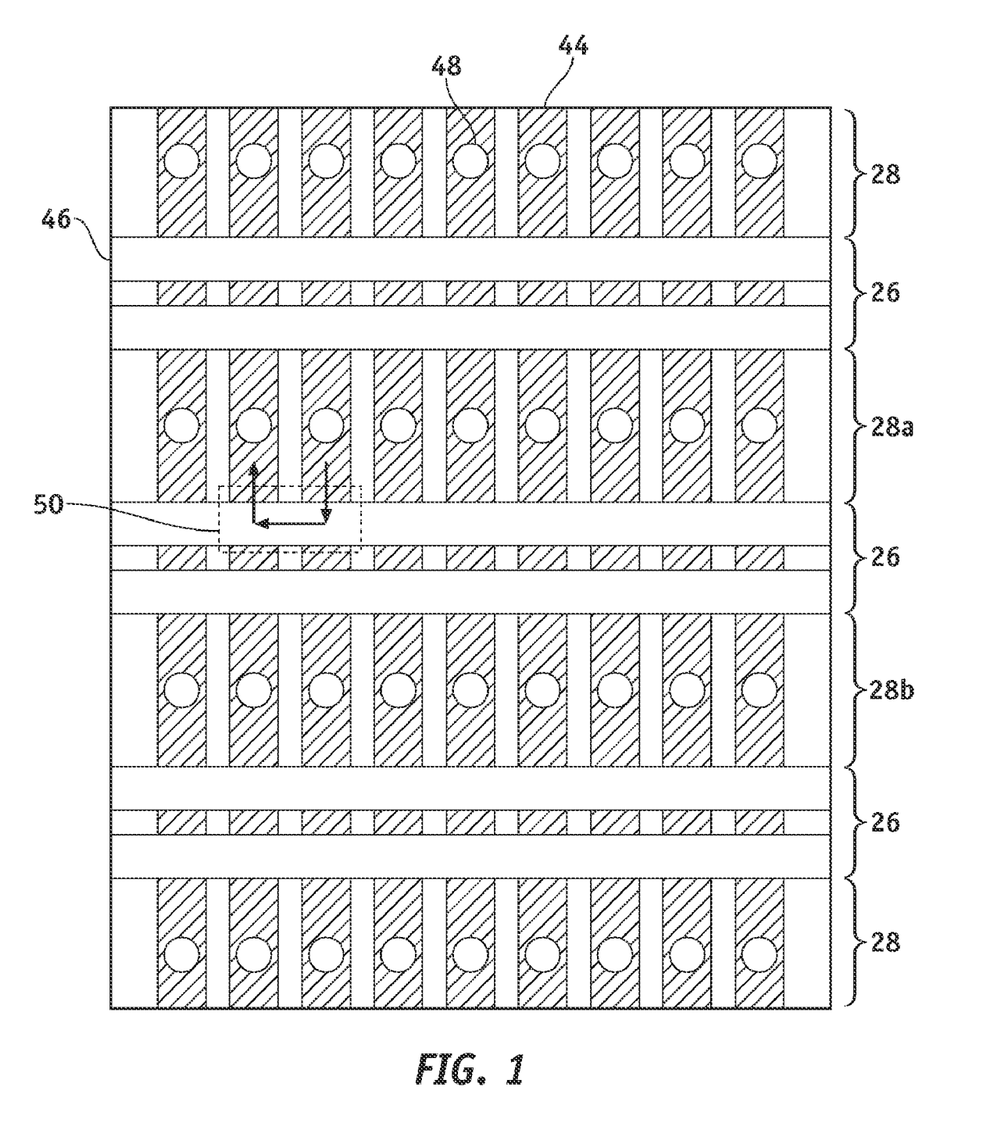
FIG. 1 is a top view illustrating a conventional memory cell of a flash memory semiconductor device.

Referring now to FIG. 1, the aforedescribed conventional semiconductor device will be described. FIG. 1 is a top view of a conventional memory cell. Bit lines 44 are embedded in the semiconductor substrate and are arranged in an upward and downward direction. An ONO film (not shown) is provided over the semiconductor substrate. Word lines 46 are provided on the ONO film to run in a width direction of the bit line 44.

The bit line 44 is formed in a diffusion layer by implanting, for example, arsenic ions, and has a relatively high resistance value. The high resistance value of the bit line 44, however, deteriorates writing and erasing characteristics. Therefore, a contact hole 48 provided for multiple word lines 46 couples the bit line 44 to an interconnection layer (not shown). The interconnection layer is made of a metal and is low in resistance, making it possible to prevent writing and erasing characteristics from deteriorating.

The contact hole 48, which couples the bit line 44 and the interconnection layer, is provided in a bit line contact region 28. The bit line contact region 28 runs in a length direction of the word line 46. A word line region 26 is arranged between the bit line contact regions 28. The word line region 26 does not include the contact hole 48 that couples the bit line 44 and the interconnection layer, in multiple word lines 46 (e.g., two word lines in FIG. 1).

The bit line 44 includes a source region and a drain region of a transistor 50. The word line 46 includes a gate electrode of the transistor 50. The memory serves as a non-volatile memory by storing the charge in the ONO film below the word line 46 (gate electrode) arranged between the bit lines 44 (the source region and the drain region). The ONO film in the transistor 50 includes two charge storage regions.

Conventionally, however, if the contact hole 48 and the bit line 44 are misaligned and the contact hole 48 is out of the bit line 44, junction current will flow between the bit line 44 and the semiconductor substrate. To prevent such junction current, an alignment margin provided between the contact hole 48 and the bit line 44 is required, even though such alignment margin is contrary to the purpose of miniaturization of the memory cell, thereby rendering it difficult to downsize the memory cell.

SUMMARY OF THE INVENTION

Therefore, it is an object of the present invention to provide a semiconductor device in which an alignment margin is ensured between a contact hole and a bit line, and to provide a memory cell therefore which can be miniaturized and a fabrication method therefor.

According to an aspect of the present invention, preferably, there is provided a semiconductor device including bit lines provided in a semiconductor substrate, word lines provided above the bit lines and running in the width direction of the bit lines, metal lines provided above the word lines and running in the length direction of the bit lines, and bit line contact regions running in the length direction of the word lines and located between word line regions in which a plurality of word lines are disposed, wherein each of the bit lines is connected with every other metal line in the bit line contact regions.

The semiconductor device is further provided wherein each of the bit lines connected to a metal line in the bit line contact region may have a contact pad wider than that of the bit line in the word line regions and provided in the bit line contact region. In accordance with the present invention, the bit line has a contact pad in the bit line contact region, further ensuring an alignment margin between the contact hole and the bit line. Accordingly, it is possible to provide a semiconductor device in which the memory cell can be further downsized.

Additionally, contact pads adjacent to each other in the width direction of the bit lines may be electrically isolated. The adjacent contact pads may be electrically isolated by a trench isolation region. In accordance with the present invention, the contact hole is not connected to the substrate and, therefore, junction current does not flow even if the contact hole deviates from the contact pad. This can ensure an alignment margin between the contact hole and the bit line and can provide a semiconductor device in which the memory cell can be downsized.

In the afore-described semiconductor device, the metal lines separated from the bit lines in a first bit line contact region may be connected to the bit lines in a second bit line contact region, the word line regions being respectively interposed between the first bit line contact region and the second bit line contact region. Each of the bit lines may be only connected to one of the metal lines in the bit line contact region and may also be provided in the word line regions at both sides of the bit line contact region. The bit lines adjacent to each other in the length direction of the bit lines may be electrically isolated by a trench isolation region.

Two of the bit lines connected to a transistor provided in the word line region may be respectively connected to adjacent metal lines in the bit line contact region provided at both sides of the word line region. The bit lines may have source regions and drain regions and the word lines may have gate electrodes provided on an ONO film formed on the semiconductor substrate.

According to another aspect of the present invention, preferably, there is provided a method of fabricating a semiconductor device including the steps of forming bit lines in a semiconductor substrate, forming word lines above the bit lines and running in a width direction of the bit lines, forming metal lines above the word lines and running in a length direction of the bit lines, and forming bit line contact regions running in the length direction of the word lines to be located between word line regions in which a plurality of word lines are disposed, wherein the step of forming the metal lines comprises the step of connecting each of the bit lines with every other metal line in the bit line contact regions. In the aforedescribed semiconductor device, each of the bit lines connected to a metal line in the bit line contact region may have a contact pad wider than that of the bit line in the word line regions and provided in the bit line contact region.

In the aforedescribed method, the step of forming the bit lines may comprise a step of forming a contact pad included in each of the bit lines which is to be connected to a metal line in the bit line contact region, the contact pad wider in the bit line contact region than that of the bit line in the word regions. In accordance with the present invention, the bit line has a contact pad in the bit line contact region, further ensuring an alignment margin between the contact hole and the bit line. Accordingly, it is possible to provide a semiconductor device in which the memory cell can be further downsized.

The method may further include forming a trench isolation region between regions in which adjacent contact pads are to be formed. In accordance with the present invention, the contact hole is not connected to the substrate and junction current does not flow even if the contact hole deviates from the contact pad. This can ensure an alignment margin between the contact hole and the bit line, and can provide a semiconductor device in which the memory cell can be downsized.

The step of forming the bit lines may comprise a step of implanting ions in regions in which the bit lines are to be formed and regions that are located in the trench isolation regions and adjacent to the bit lines. In accordance with the present invention, the trench isolation regions and the bit lines can be formed in contact with each other even if the trench isolation regions and the bit lines are out of alignment. This can prevent junction current with certainty, thereby providing a fabrication method of a semiconductor device in which the memory cell can be further downsized.

The aforedescribed method may further include forming an ONO film on the semiconductor substrate, wherein the step of forming word lines comprises forming word lines including gate electrodes on the ONO film.

In accordance with the present invention, the bit line is connected to every other metal line in the bit line contact region, enabling the bit line to be enlarged below the metal line to which the bit line is not connected. This ensures an alignment margin between the contact hole and the bit line, thereby providing a semiconductor device in which a distance between the bit lines can be reduced and the memory cell can be downsized.

DESCRIPTION OF THE PREFERRED EMBODIMENTS

A description will now be given, with reference to the accompanying drawings, of embodiments of the present invention.

First Embodiment

Figure 2:
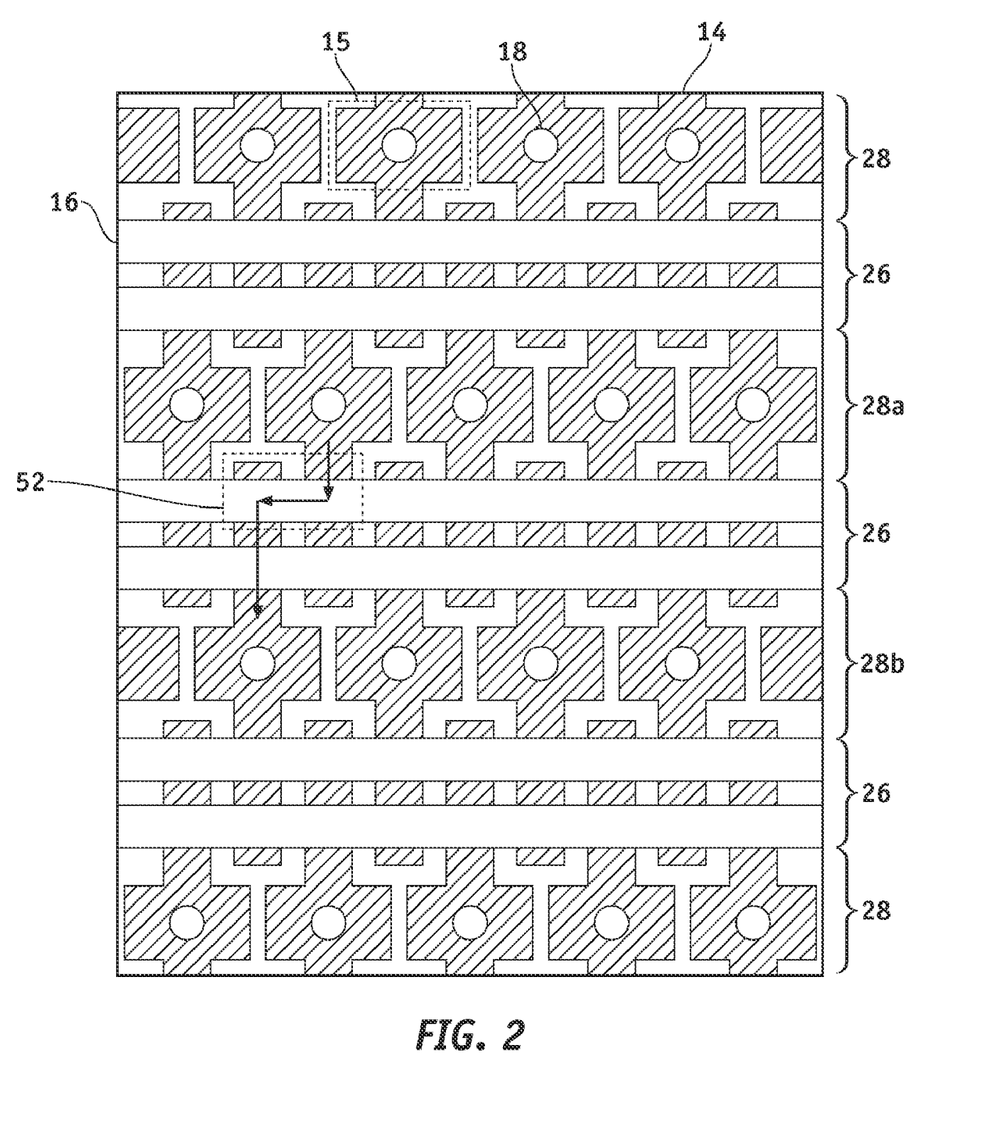
FIG. 2 is a first top view illustrating a memory cell in a flash memory in accordance with a first embodiment of the present invention.
Figure 3A:
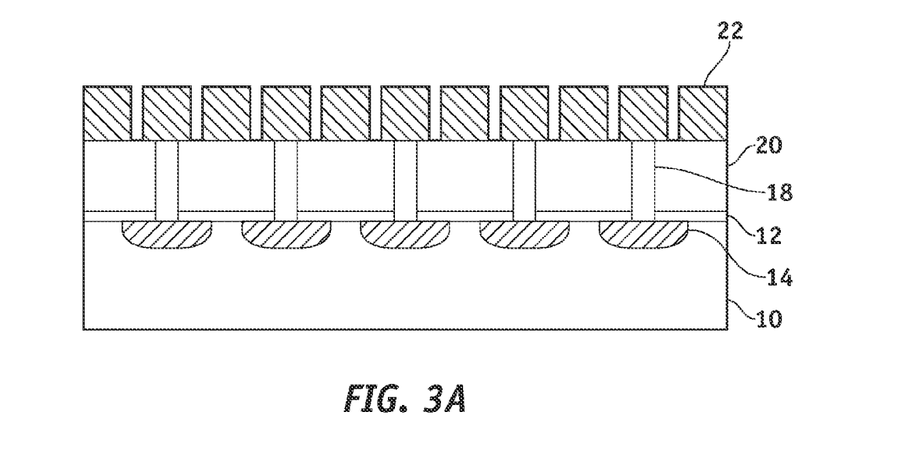
FIG. 3(a) and FIG. 3(b) are cross-sectional views illustrating the memory cell in the flash memory in accordance with the first embodiment of the present invention.
Figure 3B:
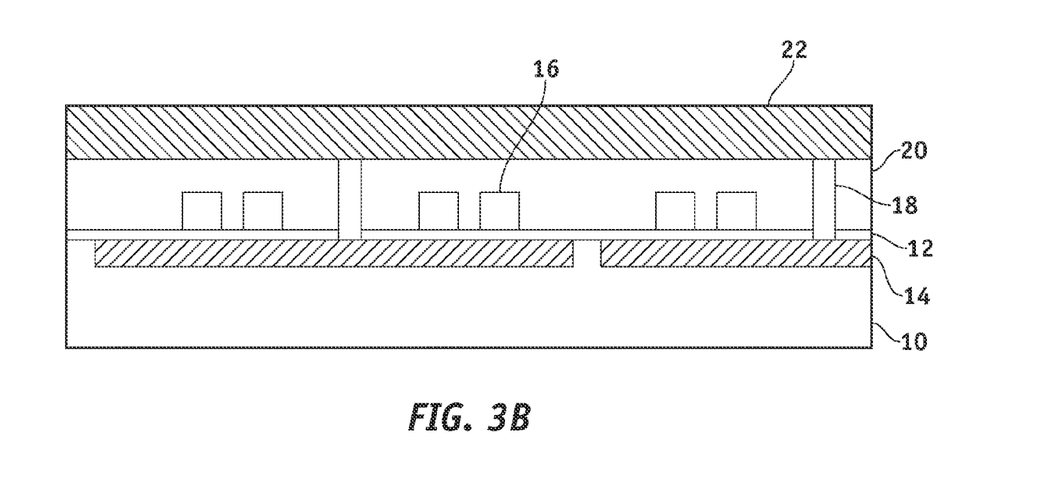
Figure 4:
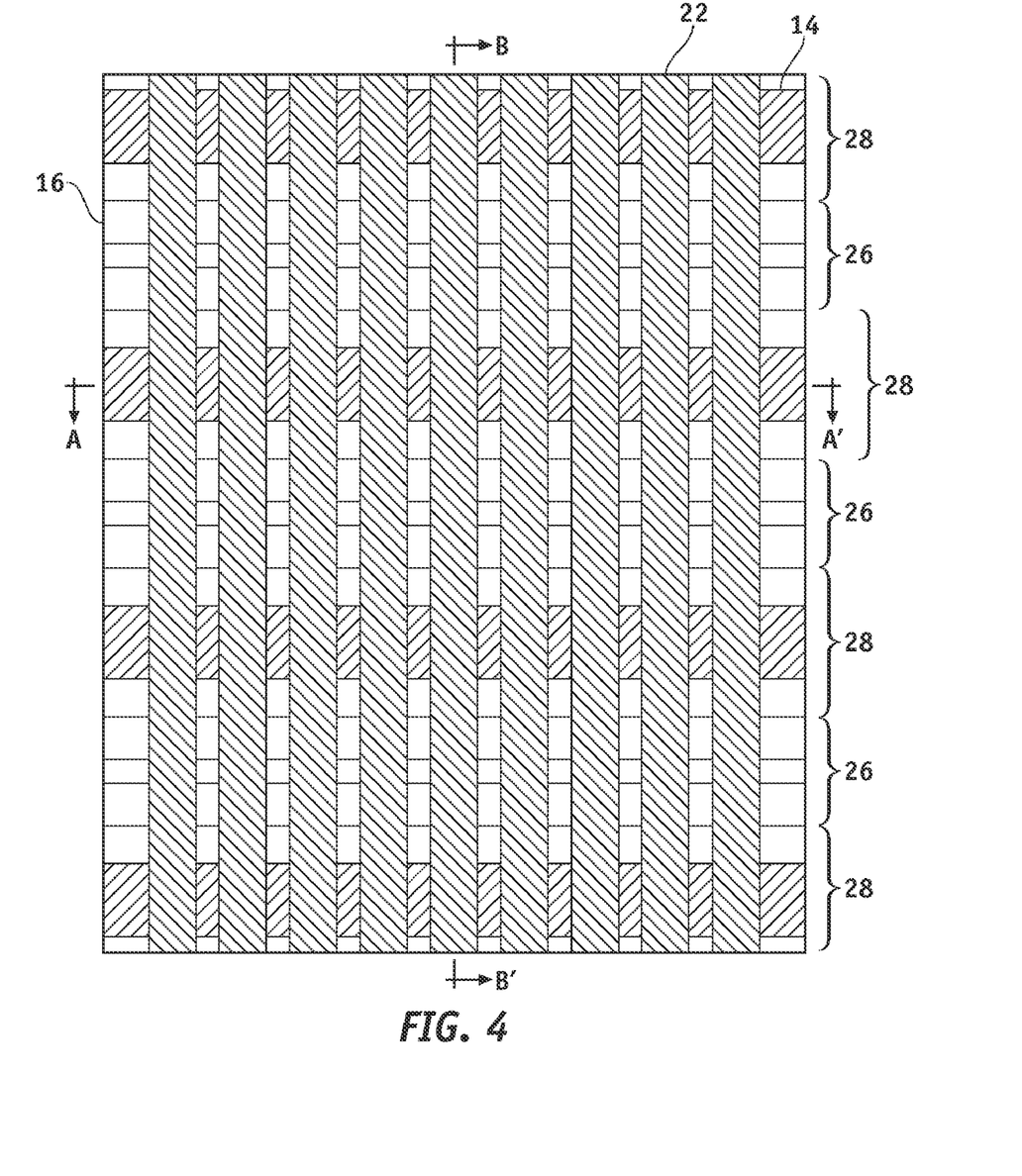
FIG. 4 is a second top view illustrating a memory cell in the flash memory in accordance with the first embodiment of the present invention.

FIG. 2 is a top view of a memory cell (wherein a protection film, an interconnection layer, and an interlayer insulating film are not shown) in a flash memory in accordance with a first embodiment of the present invention. FIG. 2 does not show an interconnection layer (metal lines) 22 to facilitate the understanding of the arrangement and shape of a bit line 14. FIG. 3(a) is a cross-sectional view of a bit line contact region 28 taken along a line A-A shown in FIG. 4. FIG. 3(b) is a cross-sectional view of the interconnection layer 22 taken along a line B-B shown in FIG. 4. FIG. 4 is a top view of the memory cell in which the interconnection layer 22 is shown.

The bit lines 14 are embedded in a semiconductor substrate 10. An ONO film 12 is provided on the semiconductor substrate 10. Word lines 16 are provided on the ONO film 12 to cross over the bit lines 14 and to run in a width direction of the bit line 14. Multiple word lines 16 are provided in a word line region 26 (two word lines are shown in FIG. 2). The bit line contact region 28 is provided between the word line regions 26 to run in the length direction of the word line 16.

The bit line 14 includes a source region and a drain region of a transistor 52. The word line 16 includes a gate electrode of the transistor 52. The flash memory in accordance with the first embodiment of the present invention serves as a non-volatile memory by storing the charge in the ONO film 12 below the word line (a gate electrode) 16 arranged between the bit lines (the source region and the drain region) 14. It is possible to include two charge storage regions in the ONO film 12 of the transistor 52.

In the bit line contact region 28, a contact hole 18 is provided to every other interconnection layer (metal lines) 22 and is connected with the bit line 14. The bit line 14 connected by the interconnection layer 22 through the contact hole 18 has a contact pad 15 in the bit line contact region 28. The contact pad 15 arranged in the bit line contact region 28 has a width wider than that of the bit line 14 arranged in the word line region 26. In addition, adjacent contact pads 15 are electrically isolated by the semiconductor substrate 10.

Figure 5A:
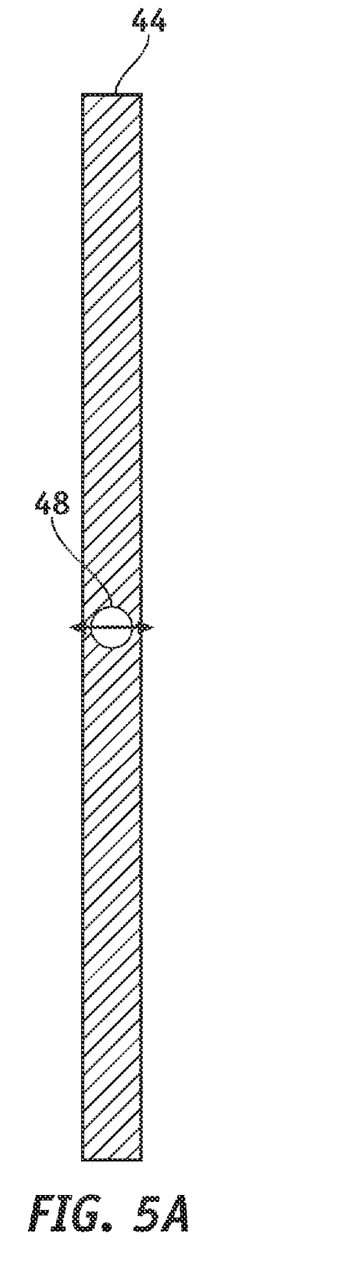
FIG. 5(a) and FIG. 5(b) are views for comparison which illustrate a bit line used in a conventional flash memory and a bit line used in the flash memory in accordance with the first embodiment of the present invention.
Figure 5B:
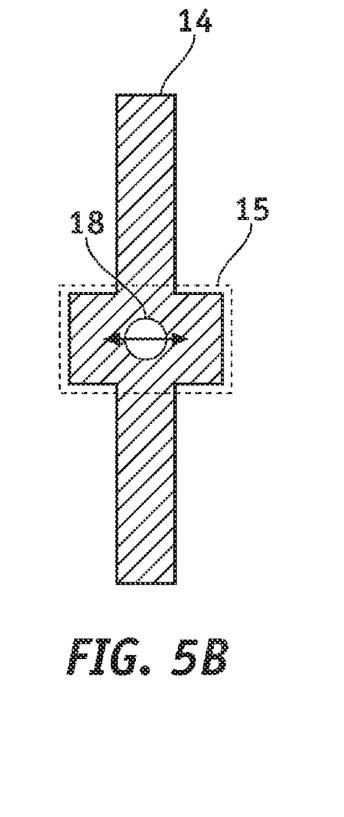

FIG. 5(a) is a top view of the bit line 44 in a conventional memory cell array. FIG. 5(b) is a top view of the bit line 14 in accordance with the first embodiment of the present invention. The bit line 14 has the contact pad 15 which is described in more detail below. Referring back to FIG. 2, in the bit line contact region 28, the contact hole 18 is provided to every other interconnection layer 22. Therefore, the bit line 14, which is coupled to the interconnection layer 22, can be enlarged below the interconnection layer 22 at positions where the contact hole 18 is not provided. Accordingly, it is possible to provide a wider contact pad 15 on the bit line 14 coupled to the interconnection layer 22 through the contact hole 18 in the bit line contact region 28.

This prevents deviation and/or misalignment of the contact hole 18 from the contact pad 15 of the bit line 14 even if the contact hole 18 and the bit line 14 are misaligned in directions indicated by right and left arrows shown in FIG. 5(b). This enables a distance between the bit lines 14 to be smaller than the conventional distance. For example, considering only the distance between the bit lines 14, the distance between the bit lines 14 can be reduced to approximately half as long as the conventional distance. Accordingly, the memory cell can be downsized.

The contact pad 15 can be provided in the bit line contact region 28, as described heretofore. In addition, the interconnection layer 22 isolated from the bit line 14 in a bit line contact region (a first bit line contact region) 28a is coupled to the bit line 14 in an adjacent bit line contact region (second bit line contact region) 28b, which is arranged to interpose the word line region 26. Thus, a single bit line 14 is coupled to a single interconnection layer 22 in a single bit line contact region 28 and is also provided to extend to the word line regions 26 at both sides of the word line region 26.

Therefore, the bit line 14 does not have to be provided in the bit line contact region 28 that is not coupled to the interconnection layer 22. In other words, the bit lines 14 adjacent to each other in the length direction are electrically isolated in the bit line contact region 28. Accordingly, as shown in FIG. 5(b), the bit line 14 employed in the first embodiment can be shortened. Thus, with the bit line 14 coupled to the interconnection layer 22, the contact pad 15 can be enlarged in the bit line contact region 28.

From another point of view, conventionally, the current flowing across the transistor 50 is supplied from the bit line contact regions 28a and 28b. Since the transistor is arranged closer to the bit line contact region 28a, the current is mainly supplied from the bit line contact region 28a and flows into the bit line contact region 28a, as indicated by the arrows shown in FIG. 1. In contrast, in accordance with the first embodiment of the present invention, the current flowing across the transistor 52 is supplied from the bit line contact region 28a and flows into the bit line contact region 28b, as indicated by the arrows shown in FIG. 2. That is to say, two bit lines 14 connected with the transistor 52 provided in the word line region 26 are respectively coupled to the interconnection layer 22 in the bit line contact regions 28 arranged at opposite sides of the word line region 26.

This eliminates the necessity that the bit line 14 extends to a bit line contact region 28 that is not coupled to the interconnection layer 22. Therefore, with the bit line 14 coupled to the interconnection layer 22 in the bit line contact region 28, the contact pad 15 can be enlarged to extend below the interconnection layer 22 in the bit line contact region 28.

Referring next to FIG. 6 to FIG. 11(b), a description will be given of a fabrication method of a flash memory in accordance with the first embodiment of the present invention. First, a tunnel oxide film made of a silicon oxide film, a trap layer made of a silicon nitride film, and a top oxide film made of a silicon oxide film are deposited, as an ONO film 12, on the P-type silicon semiconductor substrate 10 (alternatively, a P-type region formed on a semiconductor substrate), for example, by CVD. A photoresist 24 is applied onto the ONO film 12 to provide a given opening region by using a conventional exposure technique. Arsenic ions are then implanted into the semiconductor substrate 10 with the photoresist 24 serving as a mask and thermal treatment is implemented to form the bit line 14 embedded in the semiconductor substrate 10.

Figure 6:
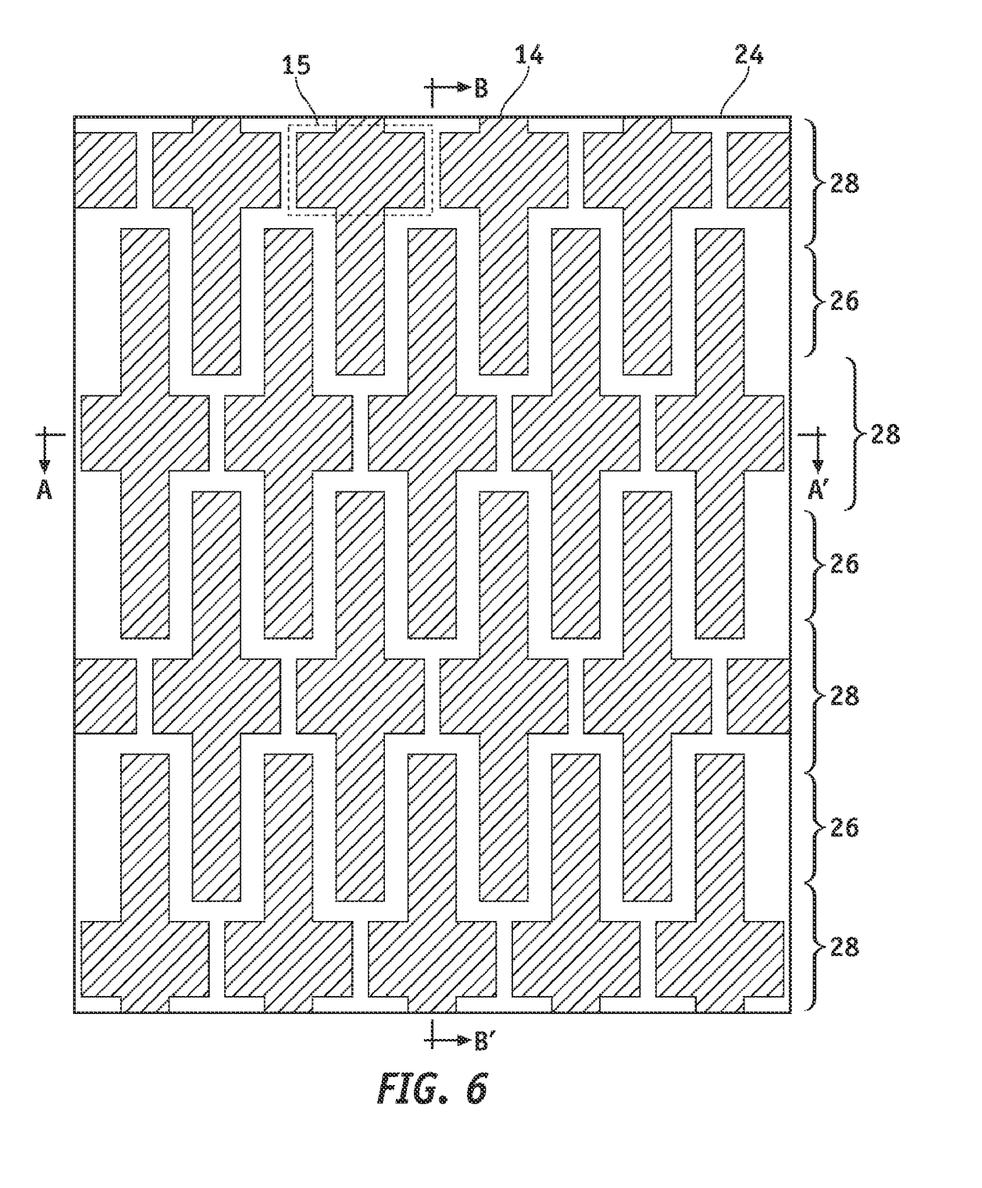
FIG. 6 is a first top view illustrating a fabrication method of the flash memory in accordance with the first embodiment of the present invention.
Figure 7A:
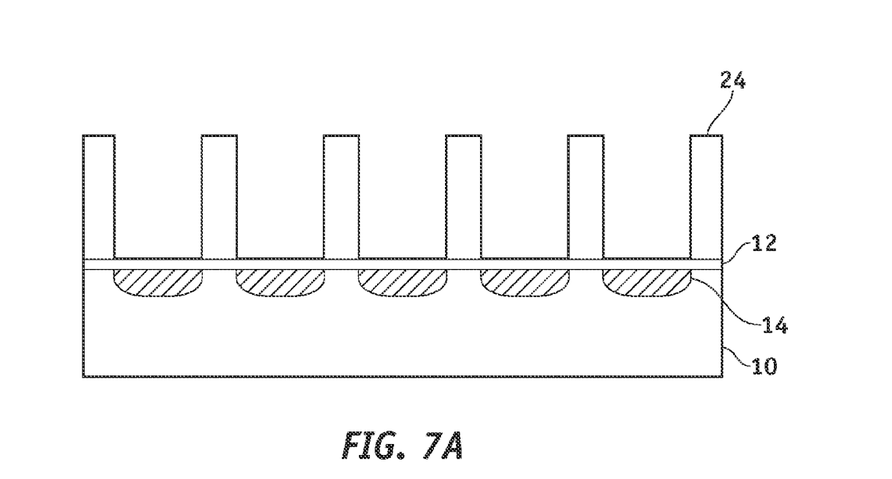
FIG. 7(a) and FIG. 7(b) are first cross-sectional views illustrating the fabrication method of the flash memory in accordance with the first embodiment of the present invention.
Figure 7B:
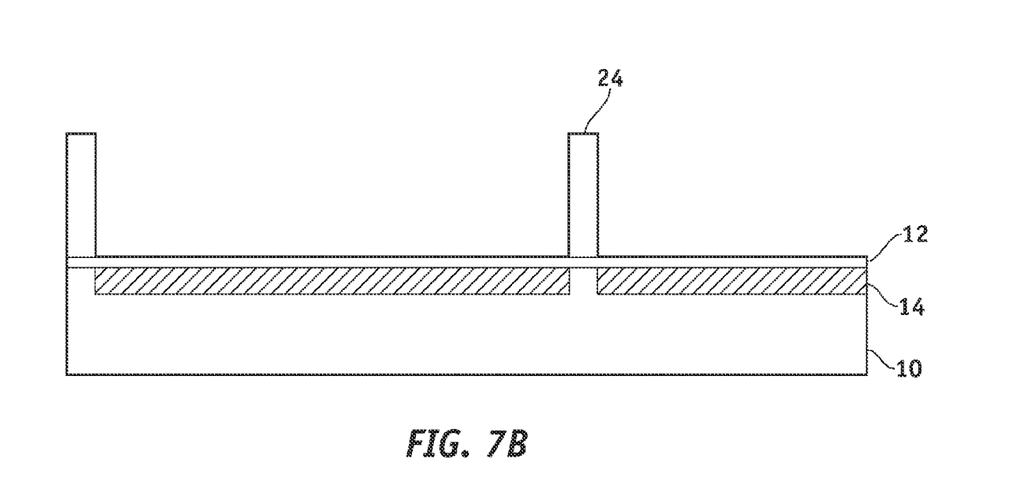

FIGS. 6, 7(a) and 7(b) illustrate the aforedescribed processes. FIG. 6 is a top view of the memory cell in accordance with the first embodiment of the present invention. FIG. 7(a) is a cross-sectional view of the bit line contact region 28 taken along a line A-A shown in FIG. 6. FIG. 7(b) is a cross-sectional view of a region in which the interconnection layer 22 is to be formed taken along a line B-B shown in FIG. 6. The contact pad 15 is formed simultaneously with the bit line 14. The contact pad 15 is included in the bit line 14 to be coupled to the interconnection layer 22 in the bit line contact region 28. The bit line 14 arranged in the bit line contact region 28 is wider than that arranged in the word line region 26. Adjacent regions in which the contact pads 15 are to be provided are isolated by the semiconductor substrate 10.

Figure 8:
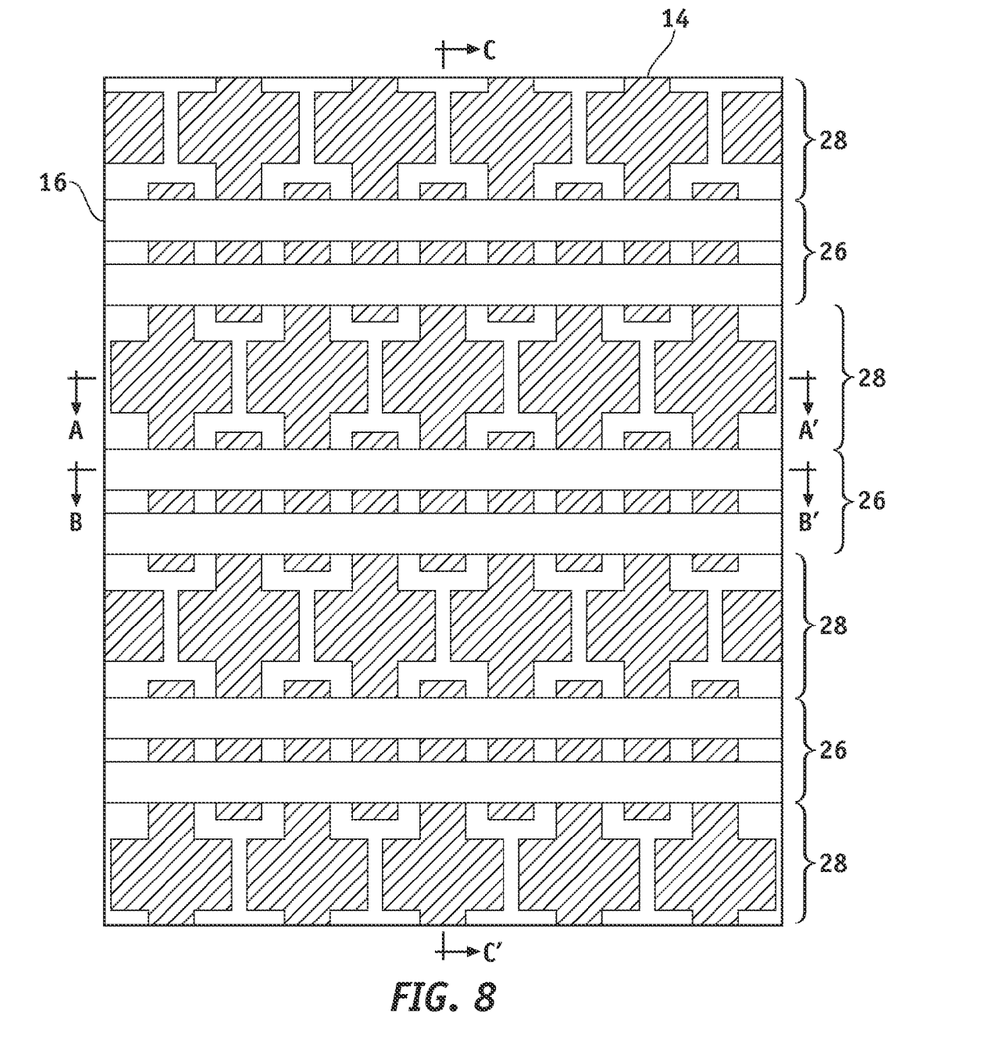
FIG. 8 is a second top view illustrating the fabrication method of the flash memory in accordance with the first embodiment of the present invention.
Figure 9A:
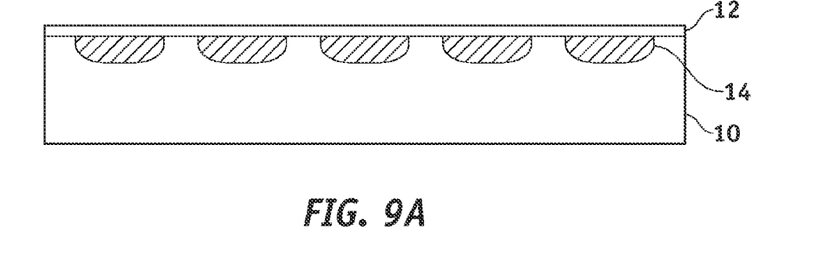
FIG. 9(a) to FIG. 9(c) are second cross-sectional views illustrating the fabrication method of the flash memory in accordance with the first embodiment of the present invention.
Figure 9B:
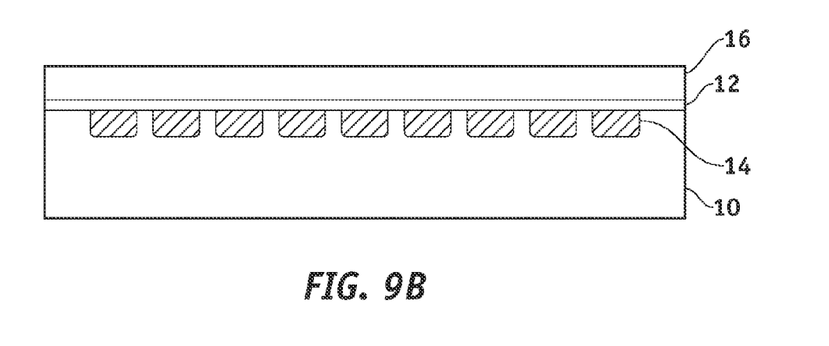
Figure 9C:
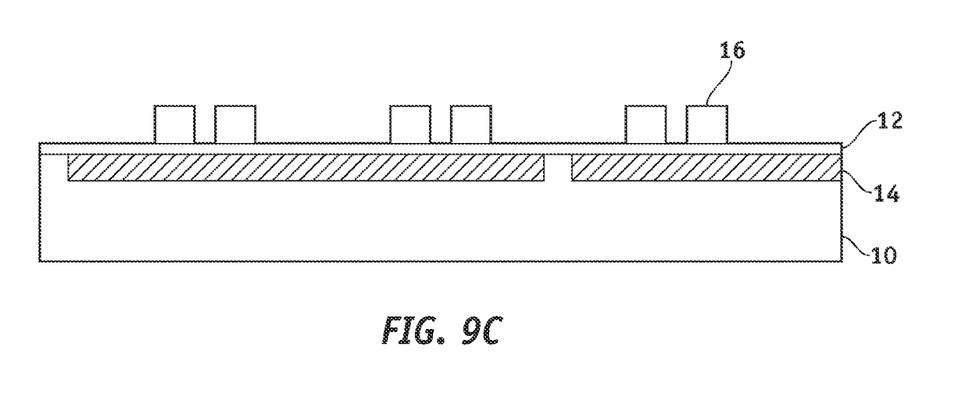

Referring next to FIGS. 8 and 9(a) to 9(c), FIG. 8 is a top view of the memory cell in accordance with the first embodiment of the present invention. FIG. 9(a) is a cross-sectional view of the bit line contact region 28 taken along a line A-A shown in FIG. 8. FIG. 9(b) is a cross-sectional view of the word line 16 taken along a line B-B shown in FIG. 8. FIG. 9(c) is a cross-sectional view of a region, in which the interconnection layer 22 is to be formed taken along a line C-C shown in FIG. 8. After the photoresist 24 is removed, a polysilicon film 16 (FIG. 9(b)) is formed on the ONO film 12. Then, a given region is removed by using conventional exposure techniques and/or etch techniques. Thus, the word line 16 that crosses over the bit line 14 is formed. In FIG. 9(b), portions in the semiconductor substrate 10 between the bit lines 14 below the word line 16 function as channels. The bit lines 14 below the word lines 16 function as source and/or drain regions. The word lines 16 over the channel function as the gate electrode. Multiple word lines 16 are provided in the word line region 26 (two word lines are shown in FIG. 8).

Figure 10:
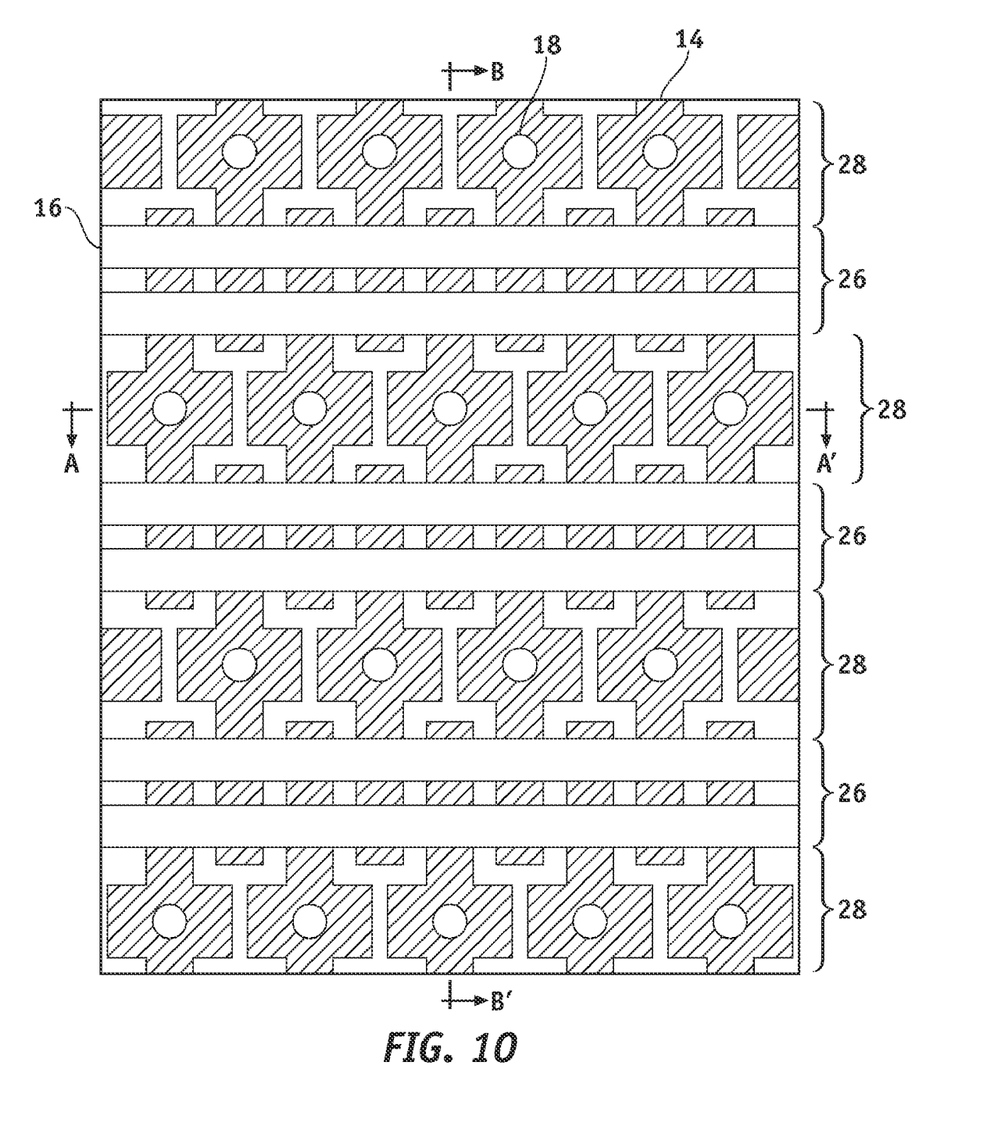
FIG. 10 is a third top view illustrating the fabrication method of the flash memory in accordance with the first embodiment of the present invention.
Figure 11A:
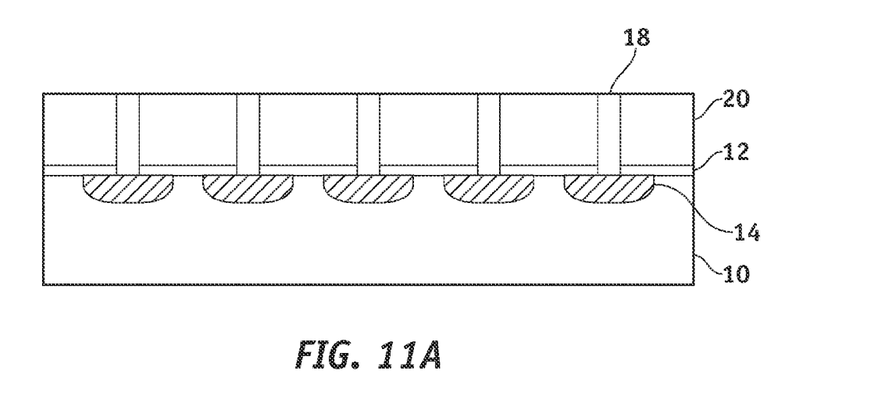
FIG. 11(a) to FIG. 11(b) are third cross-sectional views illustrating the fabrication method of the flash memory in accordance with the first embodiment of the present invention.
Figure 11B:
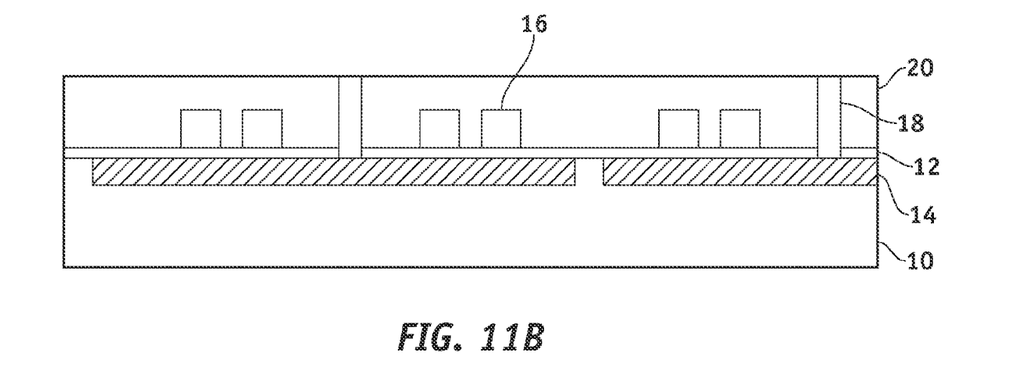

Referring to FIGS. 10, 11(a), and 11(b), FIG. 10 is a top view of the memory cell in accordance with the first embodiment of the present invention (the interlayer insulating film is not shown). FIG. 11(a) is a cross-sectional view of the bit line contact region 28 taken along a line A-A shown in FIG. 10. FIG. 11(b) is a cross-sectional view of a region in which the interconnection layer 22 is to be formed taken along a line B-B shown in FIG. 10. A silicon oxide film made of, for example, Boro-Phospho Silicated Glass (BPSG) or the like is deposited as an interlayer insulating film 20 on the ONO film 12 and the word line 16 by CVD. Contact holes 18 are formed in given regions of the interlayer insulating film 20 by using typically used exposure and etch techniques.

Next, the contact hole 18 is embedded with, for example, Ti/WN and W or Ti/TiN and W. The interconnection layer 22 that crosses over the word line 16 is made of, for example, Aluminum. Thus, the bit line 14 is connected with every other interconnection layer 22 in the bit line contact region 28, which is provided between the word line regions 26. The word line region runs in the length direction of the word line 16, and includes multiple word lines 16. The protection film (not shown) is provided over the interlayer insulating film 20 and the interconnection layer 22, thereby completing a memory cell of a flash memory in accordance with the first embodiment of the present invention.

Second Embodiment

Figure 12:
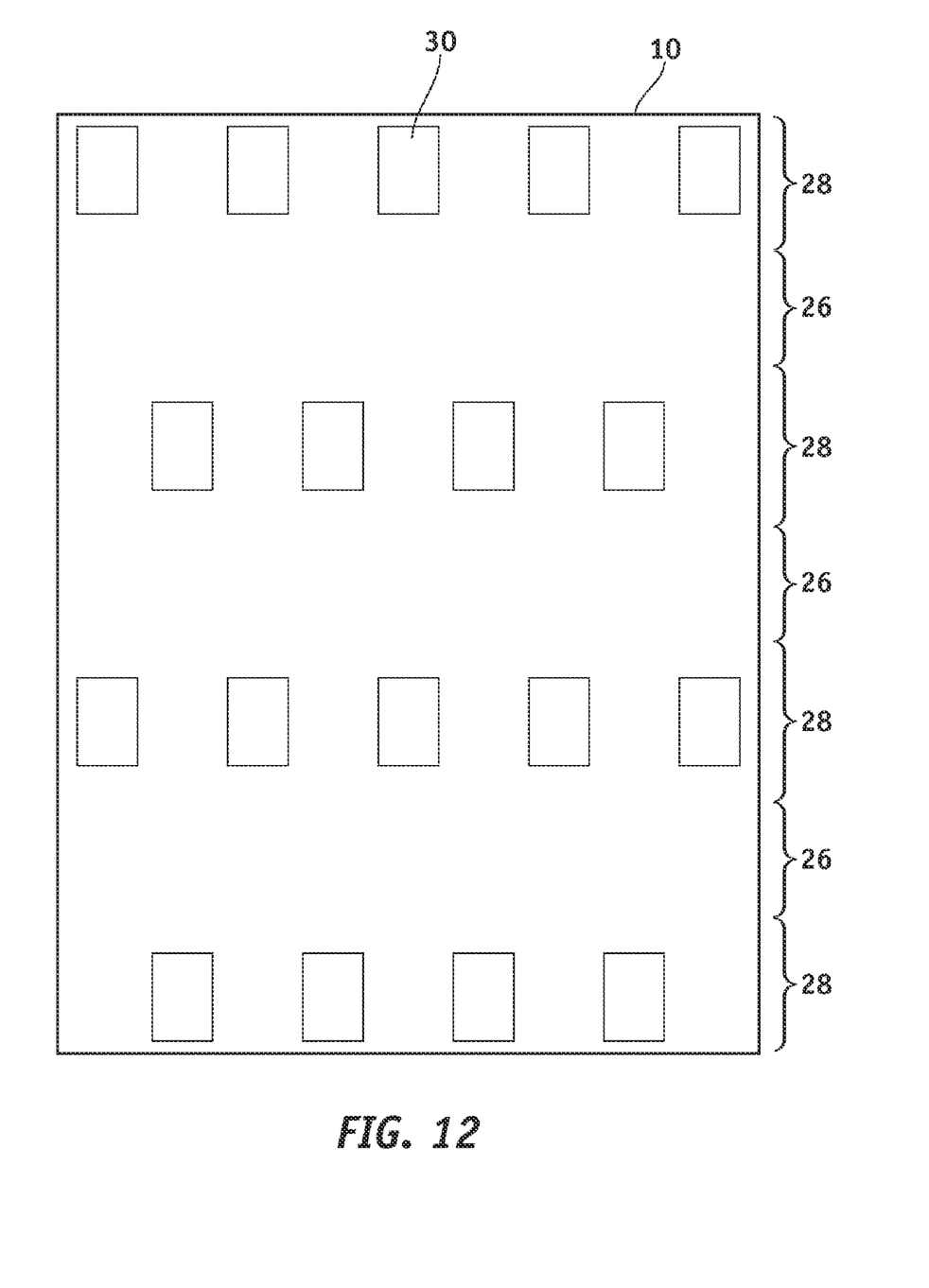
FIG. 12 is a first top view illustrating a fabrication method of a flash memory in accordance with a second embodiment of the present invention.
Figure 13:
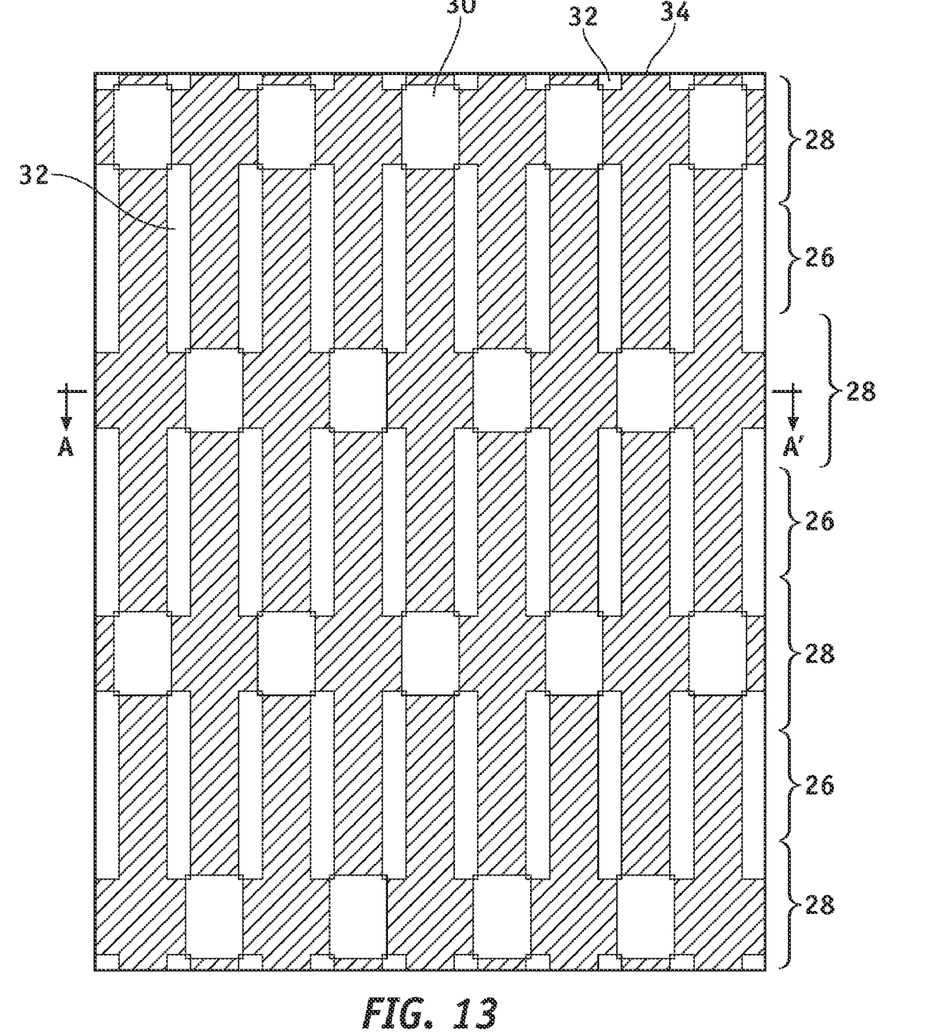
FIG. 13 is a second top view illustrating the fabrication method of the flash memory in accordance with the second embodiment of the present invention.
Figure 14:
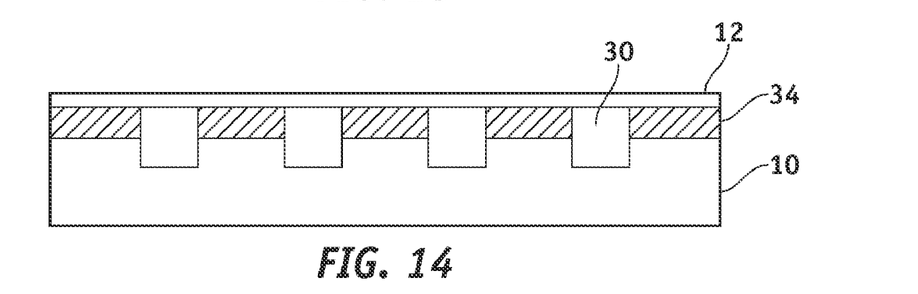
FIG. 14 is a cross-sectional view illustrating the fabrication method of the flash memory in accordance with the second embodiment of the present invention.
Figure 15:
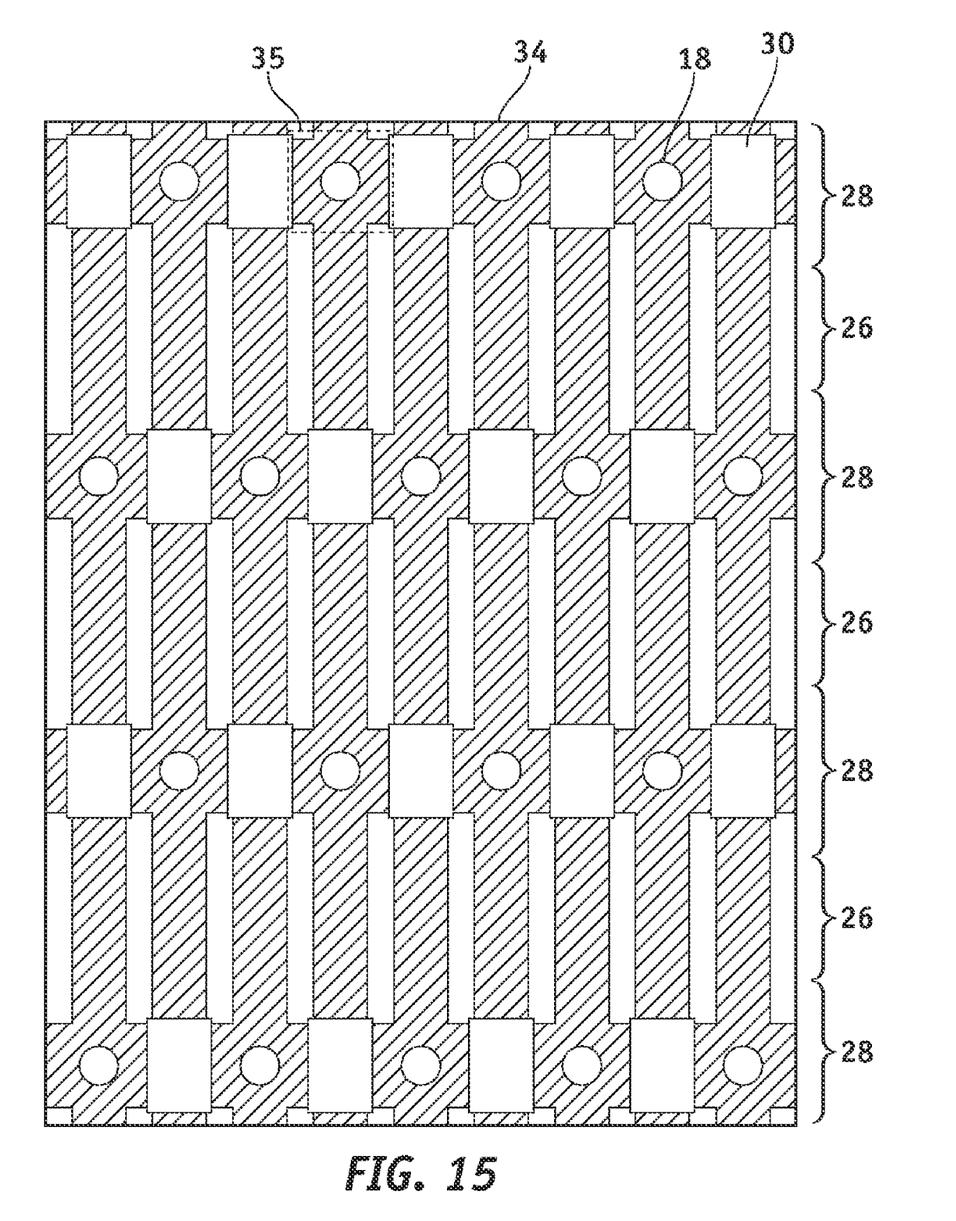
FIG. 15 is a third top view illustrating the fabrication method of the flash memory in accordance with the second embodiment of the present invention.

FIGS. 12 to 15 illustrate a memory cell of a flash memory and a fabrication method therefor in accordance with a second embodiment of the present invention. FIGS. 12, 13 and 15 are top views of the memory cell. FIG. 14 is a cross-sectional view of the memory cell taken along a line A-A shown in FIG. 13.

Referring to FIG. 12, a trench isolation region 30 is provided in given regions of the P-type semiconductor substrate 10, formed by Shallow Trench Isolation (STI). The trench isolation region 30 is a region where a trench portion is formed in the semiconductor substrate 10 and a silicon oxide film is embedded into the trench portion. The silicon semiconductor substrate is removed and the silicon oxide film is formed so leakage current can be suppressed.

The trench isolation region 30 is formed as follows. Given regions of the semiconductor substrate 10 are etched away by dry etching to form trench portions. Then, the silicon oxide film is provided over the whole surface by a method of thermal oxidation or CVD and planarized by Chemical Mechanical Polishing (CMP) or selective etching. Thus, the silicon oxide film is buried into the trench portion and the trench isolation region 30 is formed. The trench isolation region 30 is provided in a region where the contact hole 18 is not provided in the interconnection layer 22 of the bit line contact region 28. In other words, the trench isolation region is arranged in a region where adjacent contact pads 35 will be formed.

Referring to FIG. 13, the ONO film 12 is provided over the semiconductor substrate 10, as in the first embodiment. A photoresist 32 is provided on the ONO film 12. Then, an opening region of the photoresist 32 is continuously provided in the bit line contact region 28 in the direction that the word line 16 runs, and is continuously provided in a region in which the interconnection layer is to be formed in a direction that the interconnection layer 22 runs. Accordingly, the opening portion of the photoresist 32 is arranged in a lattice. Then, arsenic ions, for example, are implanted in the semiconductor substrate 10 to form a bit line 34. Referring to FIG. 14, such implanted arsenic in the trench isolation region 30 is not activated. Therefore, the bit line 34 can be formed in contact with the trench isolation region 30.

Subsequently, the flash memory in accordance with the second embodiment is produced by the same fabrication method as described in regards to the first embodiment. FIG. 15 is a top view of the memory cell of a flash memory in accordance with the second embodiment of the present invention. As before, the protection film, the interconnection layer, the interlayer insulating film, and the word line are not shown. The bit line 34 includes a contact pad 35, as in the first embodiment. Other than the trench isolation region 30 provided between adjacent contact pads, the structure and configurations are same as those described in accordance with the first embodiment. That is, the trench isolation regions 30 electrically isolate the contact pads 35, which are adjacently arranged in the width direction of the bit line 34, and also electrically isolate the bit lines 34, which are adjacently arranged in the length direction of the bit line 34. This does not cause junction leakage current to flow between the bit line 34 and the semiconductor substrate 10, even if the contact hole 18 and the bit line 34 are misaligned and the contact hole 18 deviates from the contact pad 35. In addition, this makes it possible to reduce the distance between the bit lines 34 more than the distance described in regards to the first embodiment, thereby further downsizing the memory cell.

Referring to FIGS. 13 and 14, the bit line 34 is formed by implanting, for example, arsenic ions in the bit line 34 and the trench isolation region 30 adjacently arranged to the bit line 34. This allows the bit line 34 and the trench isolation region 30 to be formed in contact with each other. Accordingly, junction current can be prevented from flowing between the bit line 34 and the semiconductor substrate 10, even if the trench isolation region 30 and the bit line 34 are misaligned. In accordance with the second embodiment, the opening region of the photoresist 32 is formed in a lattice. It is preferable that the opening region should include at least the bit line 34 and the trench isolation region 30 adjacently arranged to the bit line 34. Thus, the trench isolation region 30 being adjacently arranged to the bit line 34 denotes a range as much as an alignment margin of, for example, the trench isolation region 30 and the bit line 34.

According to another aspect of the present invention, preferably, there is provided a method of fabricating a semiconductor device including: forming bit lines in a semiconductor substrate; forming word lines above the bit lines and running in a width direction of the bit lines; forming metal lines above the word lines and running in a length direction of the bit lines; and forming bit line contact regions running in the length direction of the word lines to be located between word line regions in which a plurality of word lines are disposed, wherein the step of forming the metal lines comprises the step of connecting each of the bit lines with every other metal line in the bit line contact regions.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
   bit lines provided in a semiconductor substrate;

word lines provided above the bit lines and running in a width direction of the bit lines;

metal lines provided above the word lines and running in a length direction of the bit lines; and bit line contact regions running in the length direction of the word lines and located between word line regions in which a plurality of word lines are disposed, wherein each of the bit lines is connected only with every other metal line in the bit line contact regions, and wherein each of the bit lines has a contact pad wider in the bit line contact region at positions where the bit lines are connected with the metal lines than a width of the bit line in the word line regions.

2. The semiconductor device as claimed in claim 1, wherein contact pads adjacent to each other in the width direction of the bit lines are electrically isolated from each other.

3. The semiconductor device as claimed in claim 2, wherein the adjacent contact pads are electrically isolated from each other by a trench isolation region.

4. The semiconductor device as claimed in claim 1, wherein the metal lines not connected to the bit lines in a first bit line contact region are connected to the bit lines in a second bit line contact region, the word line regions being respectively interposed between the first bit line contact region and the second bit line contact region.

5. The semiconductor device as claimed in claim 1, wherein the bit lines adjacent to each other in the length direction of the bit lines are electrically isolated from each other.

6. The semiconductor device as claimed in claim 5, wherein the adjacent bit lines are electrically isolated from each other by a trench isolation region.

7. The semiconductor device as claimed in claim 1, wherein two of the bit lines connected to a transistor provided in the word line region are each respectively connected to adjacent metal lines in the bit line contact region provided at both sides of the word line region.

8. The semiconductor device as claimed in claim 1, wherein:

the bit lines have source regions and drain regions; and the word lines have gate electrodes provided on an ONO film formed on the semiconductor substrate.

9. A method of fabricating a semiconductor device comprising the steps of:

forming bit lines in a semiconductor substrate;

forming word lines above the bit lines and running in a width direction of the bit lines;

forming metal lines above the word lines and running in a length direction of the bit lines; and forming bit line contact regions running in the length direction of the word lines to be located between word line regions in which a plurality of word lines are disposed, wherein the step of forming the bit lines includes the step of forming a contact pad as a portion of each of the bit lines for connecting the bit lines to the metal lines in the bit line contact regions, the contact pads of the bit lines being formed wider in the bit line contact regions than the bit lines in the word line regions, and wherein the step of forming the metal lines comprises the step of connecting each of the bit lines only with every other metal line in the bit line contact regions.

10. The method as claimed in claim 9, further comprising the step of forming a trench isolation region between regions in which adjacent contact pads are to be formed.

11. The method as claimed in claim 10, wherein the step of forming the bit lines comprises the step of implanting ions in regions in which the bit lines and the contact pads of the bit lines are to be formed and in the regions that are adjacent to the bit lines in the trench isolation regions.

12. The method as claimed in claim 9, further comprising the step of forming an ONO film on the semiconductor substrate, wherein the step of forming word lines comprises forming word lines including gate electrodes on the ONO film.

* * * * *